United States Patent
Hansen et al.

(10) Patent No.: US 11,095,990 B2
(45) Date of Patent: Aug. 17, 2021

(54) MICROPHONE ASSEMBLY WITH REDUCED NOISE

(71) Applicant: KNOWLES ELECTRONICS, LLC, Itasca, IL (US)

(72) Inventors: Kristian Adelbert Hansen, Copenhagen (DK); Henrik Thomsen, Copenhagen (DK); Mohammad Shajaan, Copenhagen (DK); Jens Tingleff, Copenhagen (DK); Claus Erdmann Fürst, Roskilde (DK)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 16/445,088

(22) Filed: Jun. 18, 2019

(65) Prior Publication Data

US 2019/0387326 A1 Dec. 19, 2019

Related U.S. Application Data

(60) Provisional application No. 62/687,198, filed on Jun. 19, 2018.

(51) Int. Cl.
*H04R 19/04* (2006.01)
*H03F 1/26* (2006.01)
(Continued)

(52) U.S. Cl.
CPC .............. *H04R 19/04* (2013.01); *H03F 1/26* (2013.01); *H03F 3/213* (2013.01);
(Continued)

(58) Field of Classification Search
CPC combination set(s) only.
See application file for complete search history.

(56) References Cited

U.S. PATENT DOCUMENTS

| 5,596,289 A | 1/1997 | Liu |
| 7,190,038 B2 | 3/2007 | Dehe et al. |

(Continued)

FOREIGN PATENT DOCUMENTS

| EP | WO-0203747 A2 * | 1/2002 | ............ H03M 3/356 |
| GB | 2 525 674 A | 11/2015 | |

(Continued)

OTHER PUBLICATIONS

U.S. Appl. No. 62/135,804, filed Mar. 20, 2015, Knowles Electronics LLC.

(Continued)

*Primary Examiner* — Duc Nguyen
*Assistant Examiner* — Assad Mohammed
(74) *Attorney, Agent, or Firm* — Foley & Lardner LLP (57) ABSTRACT

A microphone assembly comprising: a housing including a base, a cover, and a sound port; a MEMS transducer element disposed in the housing, the transducer element configured to convert sound into a microphone signal voltage at a transducer output; and a processing circuit. The processing circuit comprising a transconductance amplifier comprising an input node connected to the transducer output for receipt of the microphone signal voltage, the transconductance amplifier being configured to generate an amplified current signal representative of the microphone signal voltage in accordance with a predetermined transconductance of the transconductance amplifier; and an analog-to-digital converter comprising an input node connected to receive the amplified current signal, said analog-to-digital converter being configured to sample and quantize the amplified current signal to generate a corresponding digital microphone signal.

21 Claims, 4 Drawing Sheets

(51) Int. Cl.
*H03F 3/213* (2006.01)
*H03F 3/45* (2006.01)
*H03M 3/00* (2006.01)
*H04R 3/00* (2006.01)
*H04R 19/00* (2006.01)

(52) U.S. Cl.
CPC ........ *H03F 3/45183* (2013.01); *H03M 3/424* (2013.01); *H03M 3/464* (2013.01); *H04R 3/00* (2013.01); *H04R 19/005* (2013.01); *H03F 2200/03* (2013.01); *H03F 2200/135* (2013.01); *H03F 2203/45288* (2013.01); *H04R 2201/003* (2013.01)

(56) References Cited

U.S. PATENT DOCUMENTS

| | | | |
|---|---|---|---|
| 7,473,572 | B2 | 1/2009 | Dehe et al. |
| 7,781,249 | B2 | 8/2010 | Laming et al. |
| 7,795,695 | B2 | 9/2010 | Weigold et al. |
| 7,825,484 | B2 | 11/2010 | Martin et al. |
| 7,829,961 | B2 | 11/2010 | Hsiao |
| 7,856,804 | B2 | 12/2010 | Laming et al. |
| 7,903,831 | B2 | 3/2011 | Song |
| 9,831,844 | B2 | 11/2017 | Yurrtas et al. |
| 10,298,245 | B1* | 5/2019 | De Berti .............. H03M 3/426 |
| 2005/0207605 | A1 | 9/2005 | Dehe et al. |
| 2007/0278501 | A1 | 12/2007 | MacPherson et al. |
| 2008/0175425 | A1 | 7/2008 | Roberts et al. |
| 2008/0267431 | A1 | 10/2008 | Leidl et al. |
| 2008/0279407 | A1 | 11/2008 | Pahl |
| 2008/0283942 | A1 | 11/2008 | Huang et al. |
| 2009/0001553 | A1 | 1/2009 | Pahl et al. |
| 2009/0180655 | A1 | 7/2009 | Tien et al. |
| 2010/0046780 | A1 | 2/2010 | Song |
| 2010/0052082 | A1 | 3/2010 | Lee et al. |
| 2010/0128914 | A1 | 5/2010 | Khenkin |
| 2010/0176882 | A1 | 7/2010 | Wei |
| 2010/0183181 | A1 | 7/2010 | Wang |
| 2010/0246877 | A1 | 9/2010 | Wang et al. |
| 2010/0290644 | A1 | 11/2010 | Wu et al. |
| 2010/0322443 | A1 | 12/2010 | Wu et al. |
| 2010/0322451 | A1 | 12/2010 | Wu et al. |
| 2011/0013787 | A1 | 1/2011 | Chang |
| 2011/0051954 | A1 | 3/2011 | Thomsen et al. |
| 2011/0075875 | A1 | 3/2011 | Wu et al. |
| 2011/0142261 | A1* | 6/2011 | Josefsson ................ H04R 3/00 381/107 |
| 2012/0250925 | A1* | 10/2012 | Lillelund ............ H04R 19/016 381/355 |
| 2013/0271307 | A1* | 10/2013 | Kropfitsch ........... H03G 3/3005 341/158 |
| 2015/0097711 | A1* | 4/2015 | Schuurmans ......... H03M 3/462 341/143 |
| 2016/0133271 | A1 | 5/2016 | Kuntzman |
| 2016/0134975 | A1 | 5/2016 | Kuntzman et al. |
| 2016/0149542 | A1 | 5/2016 | Mucha et al. |
| 2016/0150325 | A1* | 5/2016 | Oliaei .................. H04R 29/005 381/111 |
| 2016/0352294 | A1 | 12/2016 | Nicollini et al. |
| 2017/0077911 | A1 | 3/2017 | Badillo et al. |
| 2018/0004317 | A1* | 1/2018 | Bohannon ............. G06F 3/0418 |
| 2018/0014123 | A1 | 1/2018 | Shajaan et al. |
| 2018/0027338 | A1 | 1/2018 | Shajaan et al. |

FOREIGN PATENT DOCUMENTS

| | | |
|---|---|---|
| WO | WO-02/03747 A2 | 1/2002 |
| WO | WO-2016/153851 A1 | 9/2016 |
| WO | WO-2018/106514 A1 | 6/2018 |

OTHER PUBLICATIONS

U.S. Appl. No. 62/237,165, filed Oct. 5, 2015, Knowles Electronics LLC.
U.S. Appl. No. 62/245,028, filed Oct. 22, 2015, Knowles Electronics LLC.
U.S. Appl. No. 62/261,496, filed Dec. 1, 2015, Knowles Electronics LLC.
International Search Report and Written Opinion for International Application No. PCT/US2019/037805 dated Sep. 19, 2019, 16 pages.
International Search Report and Written Opinion for International Application No. PCT/US2019/037803 dated Sep. 19, 2019, 18 pages.

* cited by examiner

MICROPHONE ASSEMBLY WITH REDUCED NOISE

CROSS-REFERENCE TO RELATED PATENT APPLICATIONS

This application claims the benefit of and priority to U.S. Provisional Patent Application No. 62/687,198 filed Jun. 19, 2018, the entire disclosure of which is incorporated by reference herein.

BACKGROUND

Certain, typically portable, communication and computing devices such as smartphones, smart speakers, IoT (Internet of Things) devices, mobile phones, tablets, etc. are compact devices which usually are powered from rechargeable battery sources. The compact dimensions and battery source put severe constraints on the maximum acceptable dimensions and/or power consumption of microphones and microphone amplification circuit utilized in such portable communication devices.

Many such devices include various noise reducing measures at least to some certain extents. Additionally, such compact devices utilizing microphones and a microphone amplification circuit have a relatively limited overload margin, which may lead to distorted or 'clipped' amplified microphone signals; in particular for such devices utilizing a voltage-based amplifier or the like.

However, there exists a continued need to further reduce noise and thereby improve the sound quality and robustness of microphone assemblies; especially without compromising power consumption. Additionally, there exists a continued need to increase the margin before overload or distortion takes place. The overload and distortion problems are often caused by saturation of active amplification elements like transistors of the signal processing circuits.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

In the following detailed description, various embodiments are described with reference to the appended drawings. The skilled person will understand that the accompanying drawings are schematic and simplified for clarity and therefore merely show details which are essential to the understanding of the present disclosure, while other details have been left out. Like reference numerals refer to like elements or components throughout. Like elements or components will therefore not necessarily be described in detail with respect to each figure. It will further be appreciated that certain actions and/or steps may be described or depicted in a particular order of occurrence while those skilled in the art will understand that such specificity with respect to sequence is not actually required.

DETAILED DESCRIPTION

One aspect of the present disclosure relates a microphone assembly including a (microphone) housing including a base, a cover, and a sound port. The microphone assembly further includes a MEMS transducer element disposed in the housing, the transducer element being configured to convert sound into a microphone signal voltage at a transducer output. The microphone assembly further includes a processing circuit. The processing circuit includes a transconductance amplifier including an input node connected to the transducer output for receipt of the microphone signal voltage. The transconductance amplifier is configured to generate an amplified current signal representative of the microphone signal voltage in accordance with a predetermined transconductance (gm) of the transconductance amplifier. The processing circuit additionally includes an analog-to-digital converter (I-ADC) having an input node connected to receive the amplified current signal. The analog-to-digital converter (I-ADC) is configured to sample and quantize the amplified current signal to generate a corresponding digital microphone signal. Accordingly, noise is reduces or minimized thereby increasing or maximizing signal to noise ratio (SNR) as disclosed herein. An advantage, compared to implementations based on a voltage-input analog-to-digital converter is that a voltage to current conversion via an input impedance ($R_s$) of the voltage-input analog-to-digital converter is avoided. The housing may further include a host device interface with electrical contacts. The microphone assembly may therefore include a housing enclosing and supporting the transducer element and the processing circuit. A bottom portion or base of the microphone housing may include a carrier board, such as a printed circuit board, onto which the processing circuit and the transducer element are attached or fixed by a suitable bonding mechanism. The microphone housing may include a sound port or inlet allowing sound passage to the transducer element as discussed in further detail below with reference to the appended drawings.

The transducer element converts incoming sound into a corresponding electrical microphone signal. The transducer may be a condenser, piezoelectric or other electroacoustic transducer implemented using microelectromechanical systems (MEMS) or another fabrication technology. A suitable capacitive MEMS transducer element may for example exhibit a transducer capacitance between 0.5 pF and 10 pF. Capacitive transducer elements may include first and second mutually charged transducer plates, e.g. a diaphragm and back plate, respectively, supplying the microphone signal. The charge may be injected onto one of the diaphragm and back plate by an appropriate high-impedance DC bias voltage supply. The processing circuit may include a semiconductor die, for example a mixed-signal CMOS semiconductor device integrating the transconductance amplifier, the analog-to-digital converter, and optionally various other analog and digital circuits as disclosed herein. A frequency of sound to be converted by the transducer element is, at least in some embodiments, larger than 0.1 Hz and less than 200 kHz. In other embodiments, the frequency is larger than 0 Hz and less than about 200 kHz. In yet other embodiments, the frequency is about 20 Hz to about 200 kHz, for example from 20 Hz to 20 kHz. In still other embodiments, the frequency is less than 200 kHz.

The microphone assembly may be shaped and sized to fit into, e.g. portable, audio and communication devices such as smartphones, tablets and mobile phones, IoT devices, etc. The transducer element may be responsive to audible sound. An audio and communication device may also comprise a plurality of microphone assemblies as disclosed herein.

An effective input impedance, at 1 kHz, of the analog-to-digital converter (I-ADC) may be smaller than 1 k$\Omega$ (kOhm). The effective input impedance being a ratio between a input current magnitude and a voltage magnitude at the input of the I-ADC when the I-ADC is running in normal operation and (for embodiments comprising a current output feedback digital-to-analog converter (FB-DAC)) when the FB-DAC is closing a feedback loop. A load resistance ($R_P$) (i.e. an equivalent parallel combination of parasitic impedances at a point between the transconductance amplifier and the analog-to-digital converter (I-ADC) as disclosed herein), at 1 kHz, of the transconductance amplifier may be larger than 1 M$\Omega$, preferably larger than 10 M$\Omega$, such as larger than 50 M$\Omega$. The predetermined transconductance (gm) may be larger than 1/400 k$\Omega$ or more preferably larger than 1/5 k$\Omega$. An input impedance of the transconductance amplifier may be larger than 100 M$\Omega$, such as larger than 1 G$\Omega$. In some embodiments, the load resistance (or its equivalent impedance) $R_P$, at 1 kHz, of the transconductance amplifier is about 5M$\Omega$ and the predetermined transconductance gm is about 1/(5 k$\Omega$). In some other embodiments, the load resistance (or its equivalent impedance) $R_P$, at 1 kHz, of the transconductance amplifier is about 10M$\Omega$ and the predetermined transconductance gm is about 1/(2.5 k$\Omega$). In some further embodiments as disclosed herein where the analog-to-digital converter (I-ADC) further comprises a current output feedback digital-to-analog converter (FB-DAC), the impedance $R_P$ (being equivalent to the load resistance of the transconductance amplifier) is a combination of the output resistances of the FB-DAC, the transconductance amplifier, and any parasitic output impedances of circuit elements connected to the I-ADC input node. In some such further embodiments, the impedance $R_P$ (being equivalent to the load resistance of the transconductance amplifier) is the parallel combination of output impedances of all circuit elements connected between the input of the I-ADC and an electrical reference potential such as electrical ground, including leakage through any bias and protection circuits.

In at least some embodiments, the analog-to-digital converter (I-ADC) is a current-input analog-to-digital converter (I-ADC).

In some embodiments, a product of the predetermined transconductance (gm) and a load resistance (or its equivalent impedance at a point between the transconductance amplifier and the analog-to-digital converter (I-ADC) as disclosed herein) ($R_P$) of the transconductance amplifier is larger than 5. In more preferred embodiments, the product is larger than 10. In even more preferred embodiments, the product is larger than 20. In further embodiments, the product is more preferably larger than 50. In still further preferred embodiments, the product is larger than 200. In yet other preferred embodiments, the product is larger than 1000.

In some embodiments, the analog-to-digital converter (I-ADC) comprises a first integrator stage for receipt of the amplified current signal and a quantizer (Q), where the first integrator stage and the quantizer (Q) are connected in series. The first integrator stage may be configured to generate an output in response to the received amplified current signal and the quantizer (Q) may be configured to receive the output from the first integrator stage and to generate a corresponding digital microphone signal. The first integrator stage may, in some embodiments, be a current sensitive first integrator stage.

In some embodiments, the analog-to-digital converter (I-ADC) further comprises a current output feedback digital-to-analog converter (FB-DAC), where the current output feedback digital-to-analog converter (FB-DAC) is configured to receive the output of the quantizer (Q) and to generate an analog feedback signal in response to the received output of the quantizer (Q) in a feedback path to an input of the first integrator stage. The analog feedback signal may, at least in some further embodiments, be subtracted from or combined with the amplified current signal from the transconductance amplifier, in which case the result of the subtraction or the combination is supplied as the input to the first integrator stage.

In some embodiments, the quantizer (Q) is configured to generate the corresponding digital microphone signal at an resolution being a predetermined number of bits and the current output feedback digital-to-analog converter (FB-DAC) is configured operate at the predetermined number of bits to generate the analog feedback signal where the predetermined number of bits is at larger than 3 bits, preferably larger than 5 bits.

In some embodiments, the transconductance amplifier (gm) is a class AB transconductance amplifier (gm).

The analog-to-digital converter (I-ADC) output may be converted (e.g. using a digital-to-digital conversion block) to produce a multibit or single-bit digital microphone signal representative of the microphone signal depending on the particular converter type. The number of bits of the produced digital microphone signal representative of the microphone signal is or may be different from the resolution of the quantizer (Q) and/or the current output feedback digital-to-analog converter (FB-DAC). Some embodiments of the analog-to-digital converter (I-ADC) may include an oversampled converter type such as a single-bit or multibit sigma-delta converter ($\Sigma\Delta$) configured to generate a single-bit (e.g. PDM) or multibit digital microphone signal at a first sampling frequency. The multibit sigma-delta converter (IA) may be configured to generate the multibit digital microphone signal with samples of two, three or four bits. The first sampling frequency may lie between 1 MHz and 20 MHz, such as between 2.048 MHz and 4.196 MHZ, for example 3.092 MHz. The skilled person will understand that the transconductance amplifier may be integrated within the analog-to-digital converter in some embodiments. In some further embodiments, the microphone assembly further comprises an additional feedback path comprising: a digital loop filter being configured to receive and filter the digital microphone signal to provide a first digital feedback signal; an additional digital-to-analog converter (DAC) configured to convert the first digital feedback signal into a corresponding additional analog feedback signal; and a summing node at the transducer output configured to combine the microphone signal and the additional analog feedback signal, e.g. as disclosed in the Patentee's co-pending US application US 2018/014123, incorporated herein by reference in its entirety. In some further embodiments, the additional digital-to-analog converter (DAC) comprises: a hybrid Pulse-Width and Pulse-Amplitude Modulator (PWAM) configured to generate the additional analog feedback signal by: converting the first digital feedback signal into a corresponding pulse-width and pulse-amplitude modulated signal at a higher sampling frequency than a sampling frequency of the first digital feedback signal, e.g. as disclosed in the Patentee's co-pending US application US 2018/014123, incorporated herein by reference in its entirety.

The processing circuit may include a digital processor implementing at least some of the functionality as disclosed herein and/or other control functions of the processing circuit such as state switching of the digital-to-analog converter, controlling the operation of a command and control interface connectable to host processor of a, e.g. portable, communication device, e.g. a smartphone, etc. The digital processor may comprise a digital state machine and/or a software programmable microprocessor such as a digital signal processor (DSP).

Further aspects of the present disclosure relate to a method of reducing noise of a signal amplification path of a microphone. The method includes a) converting incoming sound into a corresponding microphone signal voltage at a microphone transducer output; b) generating, by a transconductance amplifier, an amplified current signal representative of the microphone signal voltage in accordance with a predetermined transconductance (gm) of the transconductance amplifier; and c) sampling and quantizing the amplified current signal by an analog-to-digital converter (ADC) to generate a corresponding digital microphone signal.

Further aspects of the present disclosure relate to a semiconductor die including a processing circuit according to any of the above-described embodiments thereof and/or as disclosed herein. The processing circuit may include a CMOS semiconductor die. The processing circuit may be shaped and sized for integration into a miniature microphone housing or package. The microphone assembly may therefore include a microphone housing enclosing and supporting the transducer element and the processing circuit. A bottom portion or base of the microphone housing may include a carrier board, such as a printed circuit board, onto which the processing circuit and the transducer element are attached or fixed by a suitable bonding mechanism. The microphone housing may include a sound port or inlet allowing sound passage to the transducer element as discussed in further detail below with reference to the appended drawings.

Further aspects of the present disclosure relate to a first and a second semiconductor die. The first semiconductor die comprises a transconductance amplifier, according to any of the above-described embodiments thereof and/or as disclosed herein, having one or two input node(s) for receipt of a microphone signal voltage (single ended or differential). The transconductance amplifier being configured to generate an amplified current signal representative of the microphone signal voltage in accordance with a predetermined transconductance (gm) of the transconductance amplifier. The second semiconductor die comprising an analog-to-digital converter (I-ADC), according to any of the above-described embodiments thereof and/or as disclosed herein, comprising (at least) an input node connected to receive the amplified current signal, said analog-to-digital converter (I-ADC) being configured to sample and quantize the amplified current signal to generate a corresponding digital microphone signal. In this way, the transconductance amplifier is implemented by a first semiconductor die and the analog-to-digital converter (I-ADC) is implemented by a separate second semiconductor die with appropriate connection(s) and/or interface(s) between them. In some embodiments, the first semiconductor die, i.e. the semiconductor die comprising the transconductance amplifier, further comprises a transducer element, according to any of the above-described embodiments thereof and/or as disclosed herein, that may include a capacitive transducer element (e.g., a microelectromechanical system (MEMS) transducer).

Further aspects of the present disclosure relate to a, e.g. portable, communication device including at least one microphone assembly according to any of the above-described embodiments thereof and/or as disclosed herein. The communication device may include an application processor, e.g., a microprocessor such as a Digital Signal Processor. The application processor may include a data communication interface compliant with, and connected to, an externally accessible data communication interface of the microphone assembly. The data communication interface may include a proprietary interface or a standardized data interface, such as one of $I^2C$, USB, UART, SoundWire or SPI compliant data communication interfaces. Various types of configuration data of the processing circuit may be transmitted from the application processor to the microphone assembly, as discussed in further detail below with reference to the appended drawings.

In some embodiments, the present microphone assembly may form part of a, e.g. portable, communication device such as a smartphone, smart speaker, IoT device, etc. where one, two, three or more microphone assemblies may be integrated for picking-up and processing various types of acoustic signals such as speech and music. Some exemplary embodiments of the present approaches, microphone assemblies and methodologies may be tuned or adapted to different types of applications through configurable parameters. These parameters may be loaded into suitable memory cells of the microphone assembly on request via the configuration data discussed above, for example, using the previously mentioned command and control interface. The latter may include a standardized data communication interface such as SoundWire, I2C, UART and SPI.

Figure 1:
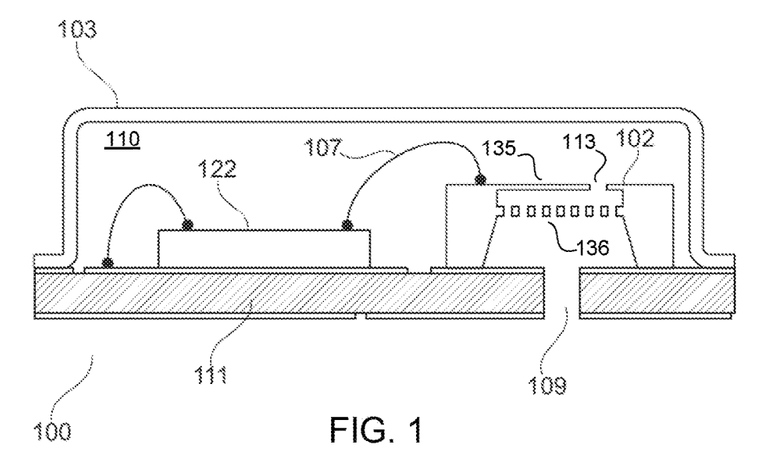
FIG. 1 is a schematic illustration of an exemplary miniature microphone assembly according to various embodiments.

FIG. 1 shows an exemplary embodiment of a microphone assembly or system 100. The microphone assembly 100 includes a capacitive transducer element 102, e.g. a microelectromechanical system (MEMS) transducer, configured to convert incoming sound into a corresponding microphone signal. The transducer element 102 may, for example, exhibit a transducer capacitance between 0.5 pF and 10 pF. The capacitive transducer element may include first and second mutually charged transducer plates, e.g. a diaphragm 135 and back plate 136, respectively, supplying the microphone signal. The charge may be injected onto one of the diaphragm 135 and back plate 136 by an appropriate high-impedance DC bias voltage supply (not shown). The microphone assembly 100 additionally includes a processing circuit 122, which may include a semiconductor die, for example a mixed-signal CMOS semiconductor device integrating the various analog and digital circuits disclosed herein. The processing circuit 122 is e.g. shaped and sized for mounting on a substrate or carrier element 111 of the assembly 100, where the carrier element likewise supports the capacitive transducer element 102. The microphone assembly 100 includes a housing lid 103 mounted onto a peripheral edge of the substrate or carrier element 111 such that the housing lid 103 and carrier element 111 jointly form a microphone housing enclosing and protecting the transducer element 102 and the processing circuit 122 of the assembly 100. The microphone housing may include a sound inlet or sound port 109 projecting through the carrier element 111, or through the housing lid 103 in other embodiments, for conveying sound waves to the transducer element 102.

The transducer element 102 generates a microphone signal at a transducer output (see e.g. item 101a of FIG. 3) in response to impinging sound. The transducer output may for example include a pad or terminal of the element 102 that is electrically coupled to the processing circuit 122 via one or more bonding wires 107 electrically interconnecting respective signal pads of the transducer element 102 and processing circuit 122.

Figure 2A:
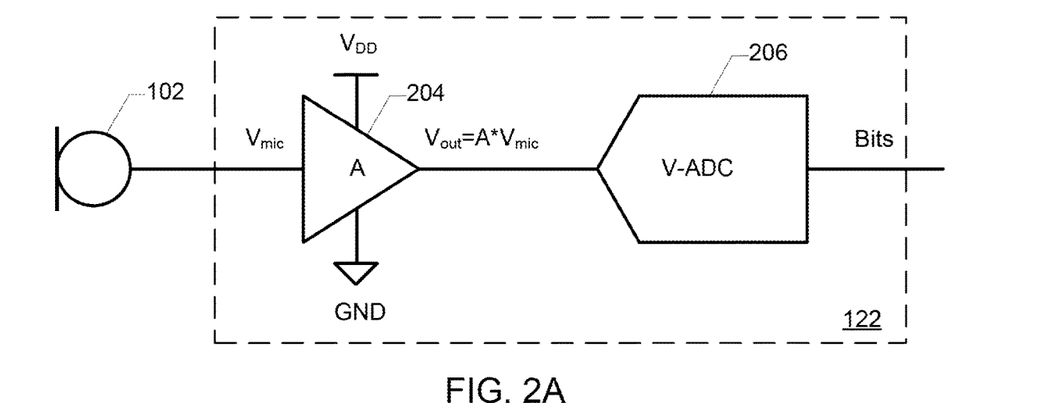
FIG. 2A illustrates a simplified electrical block diagram of a processing circuit or amplification path of a miniature microphone assembly comprising a voltage-based amplifier or buffer.

FIG. 2A illustrates a simplified electrical block diagram of a processing circuit or amplification path of a miniature microphone assembly, e.g. such as the one illustrated in FIG. 1, comprising a voltage-based amplifier or buffer 204. The voltage-based amplifier or buffer 204 may e.g. correspond to the one disclosed in the Patentee's co-pending US application US 2018/014123, incorporated herein by reference in its entirety (where ref. 204 in this specification and drawings corresponds to 104 in US 2018/014123, 206 corresponds to 106, 135 corresponds to 105, and 136 in this specification and drawings corresponds to 106 in US 2018/014123, respectively.

The processing circuit or amplification path (also simply referred to as processing circuit herein) comprises a voltage-based amplifier or buffer 204 (also referred to as 'voltage-based amplifier' or simply 'amplifier' herein) having an input node or terminal connected to a transducer output of a transducer element 102 for receipt of the microphone signal produced by the transducer element 102. The output of the voltage-based amplifier 204 supplies an amplified or buffered microphone voltage signal to a voltage-input analog-to-digital converter 206, which is configured for receipt, sampling, and quantization of the amplified or buffered microphone voltage signal to generate a corresponding digital microphone signal.

The voltage-input analog-to-digital converter 206 (denoted 'V-ADC') may be adapted to produce a multibit or single-bit digital microphone signal representative of the microphone signal depending on the particular converter type.

The voltage-based amplifier 204 amplifies the received microphone signal (received from the transducer element 102), denoted '$V_{mic}$', according to an amplification or gain factor denoted 'A' and produces the amplified or buffered microphone voltage signal, denoted '$V_{out}$', according to $V_{out}=A*V_{mic}$. The voltage-based amplifier 204 is provided with a supply voltage denoted '$V_{DD}$' in relation to an electrical reference potential such as electrical ground.

A drawback of voltage-based amplifiers 204 is that the output signal is limited by the supply voltage $V_{DD}$ and that it generally is not feasible in relation to power consumption and/or physical size of the power supply to have a sufficiently large supply voltage $V_{DD}$, which may lead to clipping or the like of $V_{out}$ ultimately potentially leading to a distorted microphone signal or a microphone signal having perceivable audio artefacts.

Furthermore, reduction of noise may be relatively limited leading to a less optimized signal to noise ratio (SNR) as will be explained further in the following. Noise may be tried reduced by increasing the amplification or gain factor 'A', but 'A' cannot arbitrarily be increased. Additionally, reduction of noise introduced by the voltage-input analog-to-digital converter V-ADC 206 may be a challenge.

Figure 2B:
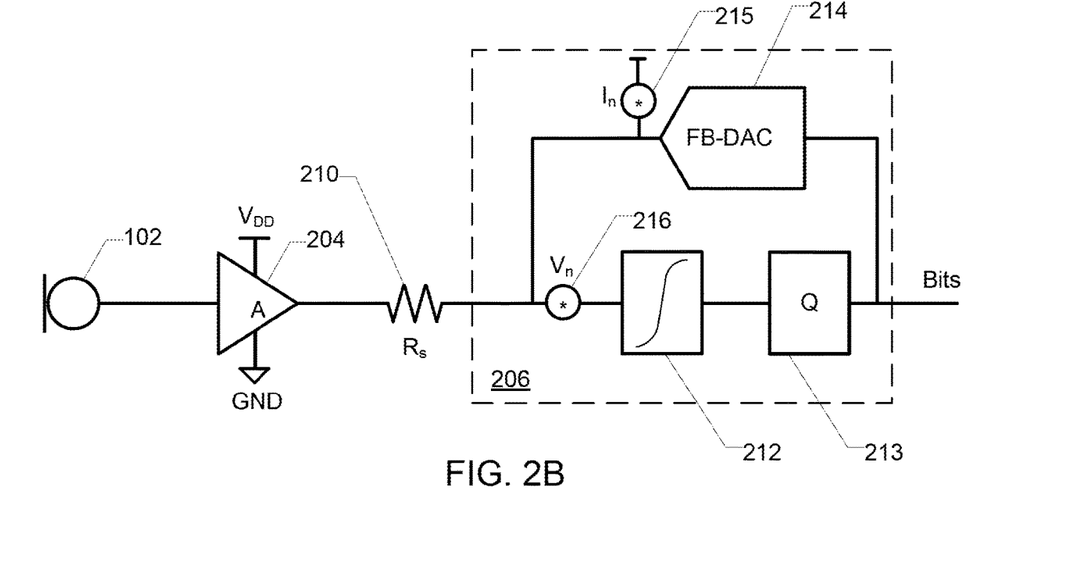
FIG. 2B illustrates a simplified electrical block diagram of a processing circuit or amplification path of a miniature microphone assembly of FIG. 2A with an exemplary embodiment of a voltage ADC.

The voltage-input analog-to-digital converter V-ADC 206 may typically equivalently be realized or embodied as illustrated in FIG. 2B by an input impedance 210 (denoted '$R_S$' in FIG. 2B) of the voltage-input analog-to-digital converter V-ADC 206 connected in series with at least a first integrator stage or the like 212 and a quantizer or the like 213 where a negative feedback loop is provided by a (voltage-output) feedback digital-to-analog converter 214 (denoted 'FB-DAC' in FIG. 2B) across the at least first integrator stage 212 and the quantizer 213, i.e. the FB-DAC receives the output signal of the quantizer 213 (the output signal being a digital representation of the microphone signal) as input and the resulting output of the FB-DAC (being an analog voltage signal converted from the digital representation of the microphone signal) is subtracted from (or combined in another suitable way with) the voltage of a node between $R_S$ and the input of the at least first integrator stage 212 with the result of the subtraction (or combination) being supplied as input to the at least first integrator stage 212. The feedback digital-to-analog converter 214 FB-DAC may in this and corresponding embodiments e.g. be a voltage output digital-to-analog converter. In alternative embodiments, the V-ADC 206 may be embodied in other suitable ways.

In such implementation(s) and corresponding ones, the total input referred noise introduced by the amplification path may be approximated by the expression:

$$V_{noise,total} \cong \sqrt{V_{noise,amp}^2 + \left(\frac{V_{noise,integrator}}{A}\right)^2 + \left(\frac{I_{noise,FBDAC} \cdot R_S}{A}\right)^2 + \left(\frac{V_{noise,R_S}}{A}\right)^2}$$

where $V_{noise,total}$ is an estimate of the total input referred noise voltage of the amplification path (i.e. from $V_{mic}$ to the output of the V-ADC 206); $V_{noise,amp}$ is the voltage at a location before the integrator stage and after the input impedance $R_S$ 210 of the V-ADC 206, i.e. the voltage supplied to the at least first integrator stage; $V_{noise,integrator}$ is the voltage across the first integrator stage; $I_{noise,FBDAc}$ (including quantizer noise) is the current at a location 215 after the feedback digital-to-analog converter FB-DAC, i.e. the current of the output of the FB-DAC 214; $V_{noise,RS}$ is the voltage across the input impedance $R_S$ 210; and 'A' is the amplification or gain factor mentioned above.

This expression provides an estimate as it omits frequency dependent quantities, which practically seen may be disregarded, in particular for operating frequencies below 200 kHz, e.g. in the range of about 0.1 kHz to about 200 kHz. Additionally, in case(s) with more than one integrator stage, the noise contribution from the first integrator stage will be dominant in relation to the noise contribution from the additional integrator stage(s) and noise from this/these may practically speaking typically also be disregarded.

As can be seen from the expression, there are three significant noise sources or noise contributors, namely the first integrator stage, the FB-DAC, and $R_S$ ($R_S$ contributes to the noise in relation to the expression of $I_{noise,FBDAc}$ and to the noise of $V_{noise,RS}$ according to the relationship $V_{noise,RS}$=SQUAREROOT of (4 kTR), where kT is Boltzmann's constant k multiplied with absolute temperature T.

In order to reduce or minimize the overall noise voltage, the contributions from the noise sources should be reduced or minimized, i.e. 'A' should be increased or maximized and the value of $R_S$ should be reduced or minimized as can be seen from the above expression. Increasing the value of $R_S$, i.e. the value of input impedance 210 of the V-ADC 206, in a processing circuit or amplification path of a miniature microphone assembly according or corresponding to FIGS. 2A and 2B will on the other hand increase the noise contributions of FB-DAC and $V_{noise,RS}$ as can also be seen from the above expression.

However, reducing the value of $R_S$ is for practical applications not generally feasible since the value of $R_S$ cannot be very small (which would be required in order to reduce the noise sufficiently) since that would load the voltage-based amplifier 204 and current consumption would increase, i.e. there is a limit on how small the value of $R_S$ can be without using a lot of current. As mentioned, the larger the value of 'A' is, the less contribution of noise will be caused by the V-ADC 206 but 'A' cannot arbitrarily be increased since the limit of 'A' is set by the supply voltage $V_{DD}$ of the voltage-based amplifier 204. The maximum 'A' is given by:

$$A \leq \frac{V_{DD}}{2V_{mic,max}}$$

Increasing the supply voltage $V_{DD}$ would enable increasing the value of 'A' but would then compromise power consumption, physical size of the power supply, etc. For at least certain typical practical applications within the context of the present invention, the value of 'A' is typically 2 or about 2.

Accordingly, it would be desirably to provide a processing circuit or amplification path of a miniature microphone assembly that reduces noise further and thereby further increases SNR. This is provided by embodiments of a processing circuit or amplification path of a miniature microphone assembly as disclosed herein with one exemplary embodiment illustrated in FIG. 3.

Figure 3:
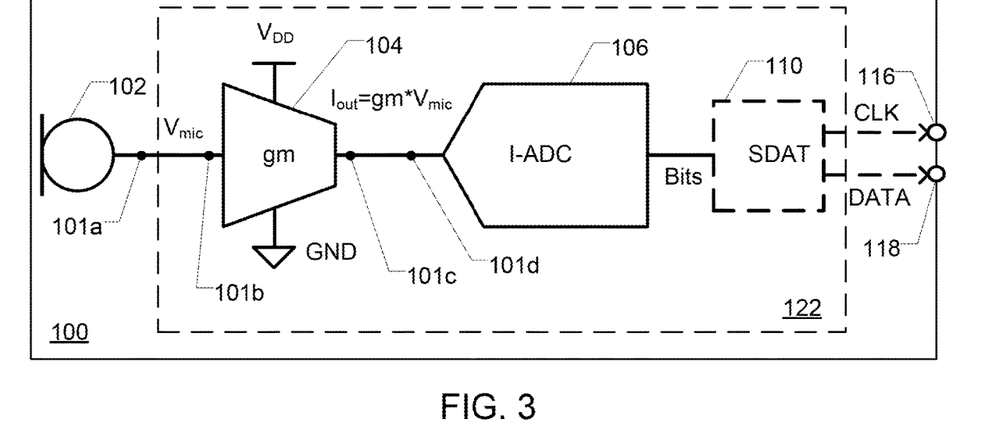
FIG. 3 illustrates a simplified electrical block diagram of a processing circuit or amplification path of a miniature microphone assembly according to various embodiments.

FIG. 3 illustrates a simplified electrical block diagram of a processing circuit or amplification path 122 of a miniature microphone assembly 100, e.g. such as the one illustrated in FIG. 1, according to various embodiments as disclosed herein. The processing circuit 122 includes a transconductance amplifier or buffer 104 (also simply referred to as transconductance amplifier herein) having an input node or terminal 101b connected to a transducer output 101a of a transducer element 102 for receipt of a microphone signal voltage produced by the transducer element 102. As output, the transconductance amplifier 104 generates an amplified current signal representative of the microphone signal voltage in accordance with a predetermined transconductance (gm) of the transconductance amplifier 104. The output of the transconductance amplifier 104 is supplied to a current-input analog-to-digital converter (I-ADC) 106, via respective input and output nodes 101c, 101d, where the I-ADC 106 is configured for sampling and quantization of the amplified current signal to generate a corresponding digital microphone signal. The current input analog-to-digital converter (I-ADC) 106 comprises at least a first integrator stage (e.g. a current sensitive first integrator stage) for receipt of the amplified current signal. The current-input analog-to-digital converter I-ADC 106 may be adapted to produce a multibit or single-bit digital microphone signal representative of the microphone signal depending on the particular converter type. A transconductance amplifier is also sometimes referred to as a current conveyor or similar and is a voltage controlled current source. Another beneficial characteristic of a transconductance amplifier in the present context is that the input impedance of it is relatively large, e.g. even in the GΩ range. In some embodiments, the input impedance of the transconductance amplifier 104 is larger than 100 MΩ, such as larger than 1 GΩ.

As mentioned, the transconductance amplifier 104 amplifies the received microphone signal (received from the transducer element 102), denoted '$V_{mic}$' in FIG. 3, according to the predetermined transconductance, denoted 'gm' in FIG. 3, of the transconductance amplifier 104 and produces an amplified or buffered current microphone signal, denoted '$I_{out}$' in FIG. 3, according to $I_{out}$=gm*$V_{mic}$. The transconductance amplifier 104 is provided with a supply voltage, denoted '$V_{DD}$', in relation to an electrical reference potential such as electrical ground. For a transconductance amplifier 104, the dimensionless amplification factor is given by gm*$R_P$, where $R_P$ is the load resistance of the transconductance amplifier 104 (or an equivalent impedance). $R_P$ is high impedance (see below).

Additionally, providing a large amplification factor 'gm*$R_P$' also reduces or minimizes noise and thereby increases or maximizes SNR, respectively, as disclosed herein and in the following. As mentioned, the output node of the transconductance amplifier 104 is high impedance and in some embodiments the load resistance (or its equivalent impedance) $R_P$, at 1 kHz, of the transconductance amplifier is larger than 1 MΩ, preferably larger than 10 MΩ such as larger than 50 MΩ. In some embodiments, the predetermined transconductance gm is larger than 1/(400 kΩ) and preferably larger than 1/(5 kΩ). The current-input analog-to-digital converter (I-ADC) 106 enables use of the (high impedance) current output of the transconductance amplifier 104 as disclosed herein and enables significant reduction of noise (see e.g. FIG. 5) and thereby significant improvement of SNR.

Figure 4:
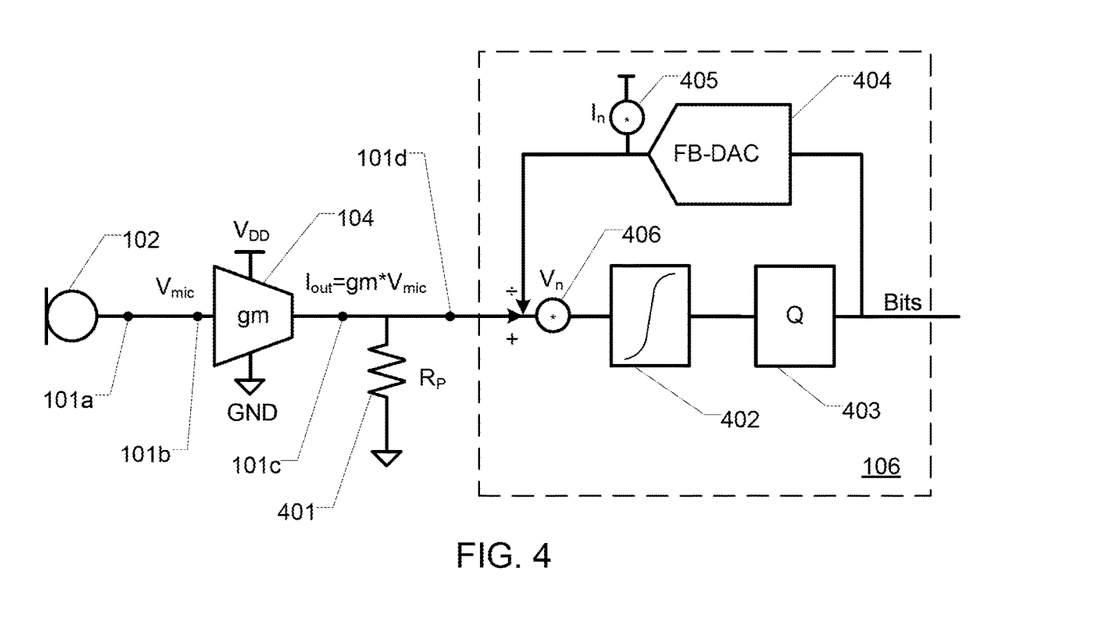
FIG. 4 schematically illustrates a simplified electrical block diagram of a processing circuit or amplification path of a miniature microphone assembly of FIG. 3 with an exemplary embodiment of a current ADC according to various embodiments.

The current-input analog-to-digital converter I-ADC 106 may e.g. be equivalently realized or embodied, e.g. as illustrated in FIG. 4 by at least a first integrator stage or the like (see e.g. 402 in FIG. 4) connected in series with a quantizer (denoted 'Q'; see e.g. 403 in FIG. 4) or the like where a negative feedback loop is provided by a current-output feedback digital-to-analog converter (denoted 'FB-DAC'; see e.g. 404 in FIG. 4) across the at least first integrator stage and the quantizer, i.e. the FB-DAC receives the output signal of the quantizer as input where the resulting output (being an analog current signal converted from the digital representation of the microphone signal) of the FB-DAC is subtracted from (or combined in another suitable way with) the current outputted by the transconductance amplifier 104 and where the result of the subtraction (or the combination) is supplied as the input to the at least first integrator stage. Alternatively, the FB-DAC may be embodied in other suitable ways; the FB-DAC converter may for example be a voltage-input digital-to-analog such as a DAC charge converter or corresponding.

In such implementation(s) and corresponding ones, the total noise introduced by the amplification path may be approximated by the expression:

$$V_{noise,total} \cong \sqrt{V_{noise,gm}^2 + \left(\frac{V_{noise,integrator}}{gm \cdot R_P}\right)^2 + \left(\frac{I_{noise,FBDAC}}{gm}\right)^2 + \left(\frac{I_{noise,R_P}}{gm}\right)^2}$$

where $V_{noise,total}$ is an estimate of the total input referred noise of the amplification path (i.e. from $V_{mic}$ to the output of the I-ADC); $V_{noise,gm}$ is the voltage of the output of the transconductance amplifier 104; $V_{noise,integrator}$ is the voltage across the first integrator stage; $I_{noise,FBDAC}$ (including quantizer noise) is the current of the output of the current-output feedback digital-to-analog converter (FB-DAC) (see e.g. 404 in FIG. 4); $R_P$ is the load resistance (or its equivalent impedance as disclosed herein) of the transconductance amplifier 104 mentioned above and herein; $I_{noise,RP}$ is the current of the load resistance (or its equivalent impedance) $R_P$; and gm is the predetermined transconductance factor of the transconductance amplifier 104.

This expression provides a noise estimate as it disregards frequency dependent quantities, which practically seen may be disregarded, in particular for operating frequencies below 200 KHz, such as operating frequencies in the range of about 20 Hz to about 200 kHz, for example from 20 Hz to 20 kHz. Additionally, in case of more than one integrator stage, the noise contribution from the first integrator stage will be dominant in relation to the noise contribution(s) from the additional integrator stage(s).

As can be seen from the expression, the main contributors to the overall noise of the I-ADC 106 is the respective noise contributions of the first integrator stage 402, the FB-DAC 404, and $R_P$ 401 as $I_{noise,RP}$=SQUAREROOT (4 kT/R) where kT is Boltzmann's constant k multiplied with absolute temperature T.

Figure 5:
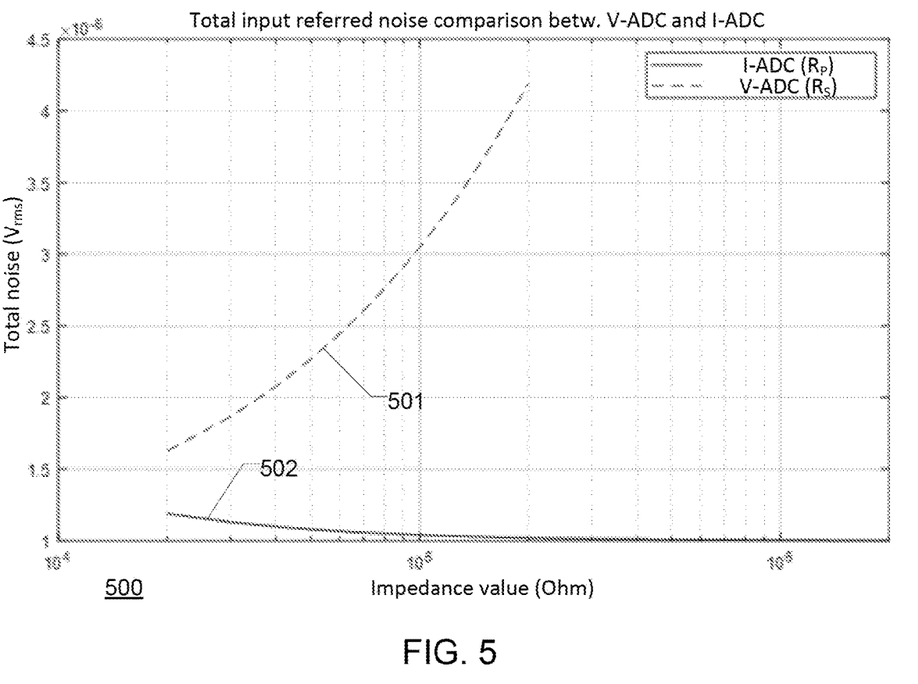
FIG. 5 schematically illustrate a graph comparing total noise (input referred) of an analog-to-digital converter (I-ADC), such as illustrated in FIGS. 3 and 4, and total noise (input referred) of a voltage-input analog-to-digital converter (V-ADC), such as illustrated in FIGS. 2A and 2B, for implementations with comparable 'cost'.

Therefore to reduce the total noise voltage, the product of gm and $R_P$ should be large, for example at least larger than 5, as discussed below and herein. The total noise voltage may for example be decreased by increasing the respective value of gm and/or of $R_P$ to the largest practically possible value for a given use or application. A large value of $R_P$ reduces $I_{noise,RP}$, which is easily implemented in integrated semiconductor technology. Furthermore gm*$R_P$ should be at or above a predetermined value, e.g. at about 5, preferably larger than 10, more preferably larger than 20 or larger than 50, more preferably larger than 200, or larger than 1000, which will reduce the noise contribution from the first integrator stage 402 significantly. In some embodiments, the load resistance (or its equivalent impedance) $R_P$, at 1 kHz, of the transconductance amplifier is larger than 1 MΩ, preferably larger than 10 MΩ such as larger than 50 MΩ, when the predetermined transconductance gm is larger than 1/(400 kΩ) and preferably larger than 1/(5 kΩ). In some embodiments, the load resistance (or its equivalent impedance) $R_P$, at 1 kHz, of the transconductance amplifier is about 5MΩ and the predetermined transconductance gm is about 1/(5 kΩ). In some other embodiments, the load resistance (or its equivalent impedance) $R_P$, at 1 kHz, of the transconductance amplifier is about 10MΩ and the predetermined transconductance gm is about 1/(2.5 kΩ). This provides a significant reduction of noise, e.g. as illustrated in FIG. 5.

The I-ADC 106 may be configured to generate the multibit digital microphone signal with samples of two, three or four bits with a sampling frequency that may lie between 1 MHz and 20 MHz, such as between 2.048 MHz and 4.196 MHZ, for example 3.092 MHz. However, in some embodiments, the total noise voltage is reduced (e.g. further) by reducing the noise contribution of the current-output feedback digital-to-analog converter FB-DAC by increasing the number of bits of the digital microphone signal, i.e. the output of the quantizer, where the current-output feedback digital-to-analog converter FB-DAC is configured to operate at that number of bits. In some embodiments, the number of bits is larger than 3 bits and preferably larger than 5 bits.

Accordingly, it is possible achieve a signal transfer function (STF) of approximately 1 (i.e. very close to 1) and a noise transfer function (NTF) being much smaller than 1 (i.e. <<1) and virtually approximately about 0 (i.e. very close to 0), respectively, of a processing circuit or amplification path of a miniature microphone assembly according to the embodiment(s) of FIG. 3 and/or FIG. 4 and corresponding ones.

One exemplary embodiment—and variations thereof—of the transconductance amplifier or current conveyor 104 is illustrated and are described in connection with FIG. 6.

Optionally, the (noise reduced/minimized) output, i.e. a digital microphone signal, of the current-input analog-to-digital converter I-ADC 106 is provided or transmitted to an input of a command and control interface 110, denoted SDAT in FIG. 3, in some embodiments configured to receive various types of data commands from a host processor (now shown) of a portable communication device (e.g. a smartphone). The command/control interface 110 may include a separate clock line 116 (CLK) that clocks data on a data line 118 (DATA) of the interface 110. The command and control interface 110 may include a standardized data communication interface according to various serial data communication protocols, e.g., I²C, USB, UART, SoundWire or SPI. The command and control interface 110 is in some embodiments configured to structure and encode the digital microphone signal in accordance with the relevant protocol of the interface 110 and transmits the digital microphone signal to the host processor. The microphone assembly 100 may be configured to receive and utilize various types of configuration data transmitted by the host processor. The configuration data may include data concerning a configuration of the processing circuit 122.

FIG. 4 schematically illustrates a simplified electrical block diagram of a processing circuit or amplification path of a miniature microphone assembly of FIG. 3 with an exemplary embodiment of a current-input ADC (I-ADC) according to various embodiments.

The transducer element 102 and the transconductance amplifier 104 correspond to the ones shown and explained in connection with FIG. 3 and as otherwise disclosed herein including relevant variations and embodiments.

The shown current-input ADC (I-ADC) 106 comprises at least one (first) integrator stage or the like 402, a quantizer or the like 403 (denoted 'Q'), and a current-output feedback digital-to-analog converter 404 (denoted 'FB-DAC'). In at least some embodiments, the (first) integrator stage or the like 402 is a (first) current sensitive integrator stage. The integrator stage(s) and the quantizer Q is connected in series where the quantizer Q receives the output of the integrator stage(s). The FB-DAC 404 is part of a feedback path extending at least from the digital microphone signal at the output of the quantizer Q and back to the input of the first integrator stage 402 where the output of the I-DAC is combined with or subtracted from the output signal of the transconductance amplifier 104 closing the feedback loop, i.e. the subtracted or combined signal is provided as input to the first integrator stage 402. Furthermore, a load resistance of the transconductance amplifier or an equivalent impedance $R_P$ is connected in parallel with the feedback loop of the at least first integrator stage 402, the quantizer Q 403, and the FB-DAC 404. The transducer element 102 is connected to a transducer output 101*a* that is connected to an input node or terminal 101*b* of the transconductance amplifier 104. An output node 101*c* of the transconductance amplifier 104 is connected to an input node 101*d* of the I-ADC 106 and the impedance $R_P$ (being equivalent to the load resistance of the transconductance amplifier) is (virtually) located between the output node 101*c* and the input node 101*d*. Some of the nodes may be shared or combined. The equivalent impedance $R_P$ may—for embodiments corresponding to the one in FIG. 4—be a combination of the output resistances of the FB-DAC, the transconductance amplifier, and any parasitic output impedances of circuit elements connected to the I-ADC input node. In some such further embodiments, the impedance $R_P$ (being equivalent to the load resistance of the transconductance amplifier) is the parallel combination of output impedances of all circuit elements connected between the input of the I-ADC and an electrical reference potential such as electrical ground, including leakage through any bias and protection circuits.

Further illustrated is virtual noise sources $V_n$ 406 and $I_n$ 405 that relates to the expression for an estimate of the total input referred noise of the amplification path (i.e. from $V_{mic}$ to the output of the I-ADC 106) given and explained e.g. in connection with FIG. 3.

According to the illustrated embodiment, and corresponding once, the output signal from the transconductance amplifier 104, i.e. $I_{out}$, is processed by subtracting the current output of FB-DAC 404 and the resulting current, i.e. an error signal, is integrated into a voltage by the at least first integrator. The shown embodiment can be implemented in a simple way so that the amplitude of this integrated error signal is less than $V_{DD}$ without a need to reduce $R_P$, thereby allowing for both lower noise and a high gain or amplification factor of the signal present before the I-ADC 106. The gain or amplification factor (given by 'gm*$R_P$') can be much larger than 'A' according to the processing circuit or amplification path of FIGS. 2A and 2B). Since, the this integrated error signal is less than $V_{DD}$, clipping or the like of $I_{out}$ is avoided which could otherwise lead to a distorted microphone signal or a microphone signal having perceivable audio artefacts in certain situations.

FIG. 5 schematically illustrate a graph comparing total noise (input referred in audio band) of an analog-to-digital converter (I-ADC), such as illustrated in FIGS. 3 and 4, and total noise (input referred) of a voltage-input analog-to-digital converter (V-ADC), such as illustrated in FIGS. 2A and 2B, for implementations with comparable 'cost'.

Illustrated in FIG. 5 is a graph 500 illustrating total noise, input referred, for a V-ADC 501 and an I-ADC 502 for a range of values of load resistance/impedance values for $R_S$ and $R_P$, respectively, where other parameters are set to realistic respective values and otherwise fixed. For the illustration, the implementation 'cost' (including supply current and/or supply voltage) is set to be the same for the best performing (in relation to low/lowest noise) V-ADC ($R_S$=20 kΩ) and the best performing (in relation to low/lowest noise) I-ADC ($R_P$=2 MΩ), with the V-ADC gain 'A'=2 and the I-ADC gm=1/5000. The noise contributions from the input voltage amplifier and the transconductance gm are set to the same level (1e-6 Vrms (root-mean-square voltage) and the noise contribution from the respective FB-DAC and quantizer are set to zero for comparison and since these may be reduced for both designs by proper design practices. The respective curves 501, 502 clearly illustrate that the overall input referred noise is always significantly better for the I-ADC implementation as seen by the values of curve 502 always being significantly lower than the values of curve 501. While the noise may be reduced for the V-ADC by reducing $R_S$, the implementation 'cost' of reducing the $R_S$ value in a V-ADC is significant (e.g. reducing the $R_S$ by a predetermined factor leads to an increase in supply current requirement by the same predetermined factor).

Figure 6:
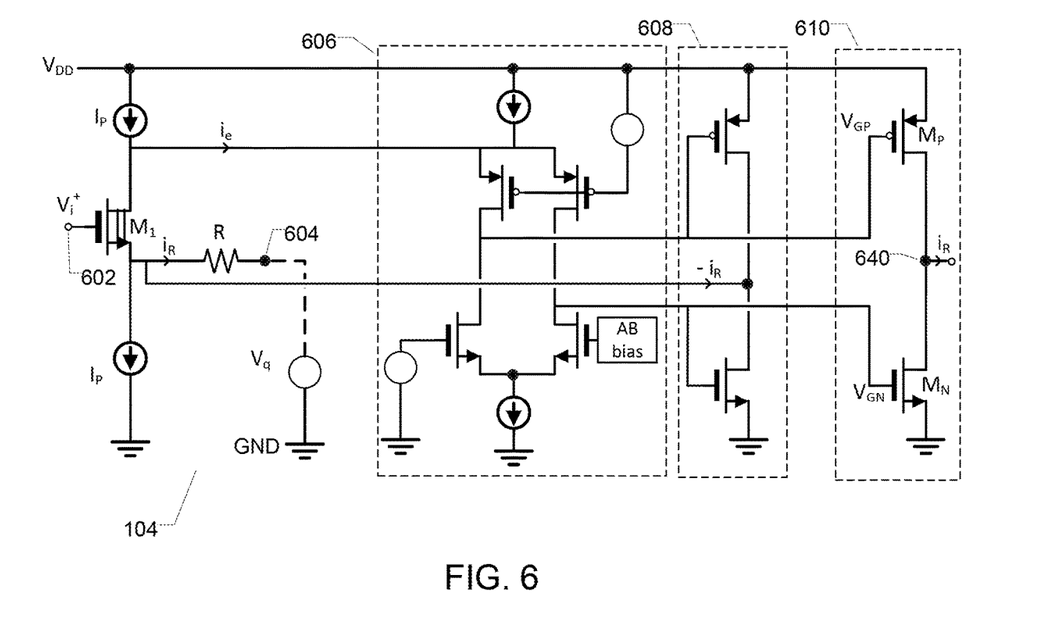
FIG. 6 is a simplified schematic circuit diagram of an exemplary transconductance amplifier suitable for integration or incorporation in the processing circuit of the present microphone assembly.

FIG. 6 is a simplified schematic circuit diagram of an exemplary transconductance amplifier 104 suitable for integration or incorporation in the processing circuit 122 of the present microphone assembly 100. The skilled person will understand that the transconductance amplifier 104 may be used in other types of applications than microphone assemblies for example as a sensor amplifier for various types of sensors like ultrasound sensors, optical or piezo-ceramic accelerometers, strain-gauge devices etc. The positive DC supply voltage VDD may be between 1.2 V and 3.3 V, such as around 1.4 V, depending on application specific requirements and characteristics of the particular semiconductor process used for integration of the transconductance amplifier 104. The quiescent current consumption of the transconductance amplifier 104 may be set to a value between 75 µA and 250 µA for typical microphone applications.

The simplified schematic circuit diagram depicts on-half of a complete transconductance amplifier handling one input polarity of the microphone signal voltage from the MEMS transducer element (102 of FIG. 1) while a corresponding second half (not shown) of the transconductance amplifier 104 handles the opposite polarity of the microphone signal voltage. Hence, a differential amplified current signal, representative of a microphone signal voltage applied between a first input node 602 (Vi+) and a second input node (not shown) of the transconductance amplifier 104, is generated or provided between the illustrated output node 640 and its complementary output node (not shown) of the transconductance amplifier 104. The complete circuit of the transconductance amplifier 104, i.e. both half-circuits, is preferably fully symmetrical such that the common node 604 at the midpoint of the resistance element or resistor R is constant, i.e. without signal voltage swing, for a balanced or differential input signal such as the previously discussed differential microphone signal voltage. The voltage source Vq is merely a symbolic illustration showing the resistor current IR has a return path allowing the flow of current. The resistance of the resistor R sets the transconductance (gm) of the transconductance amplifier 104 and R may have a resistance typically between 1 kΩ and 5 kΩ.

The input stage of transconductance amplifier 104 comprises an input transistor M1 which may comprise a MOSFET or JFET, since these devices exhibits very large input impedance. The input transistor M1 may for example be a native NMOS transistor. The positive phase of the microphone signal voltage is applied to a gate terminal of the input transistor M1 which exhibits a large input impedance and therefore allows coupling directly to one of the backplate and diaphragm of the MEMS transducer element (102 of FIG. 1) without representing any significant electrical loading of the MEMS transducer element. A DC bias current through the input transistor M1 is fixed by a pair of constant current sources IP. The DC bias current may lie between 10

μA and 100 μA where a higher bias current generally lowers the input referred noise voltage albeit at the expense of increasing power consumption.

The transconductance amplifier 104 additionally comprises a class AB output stage 610 comprising complementary PMOS/NMOS output transistors MP and MN driven by respective drive voltage VGP and VGN. The class AB output stage is DC biased by an AB bias circuit 606. The class AB output stage 610 typically operates without signal feedback to the input node 602 of the transconductance amplifier 104. The lack of signal feedback from the class AB output stage 610 ensures that the transconductance amplifier 104 exhibits high output impedance at the output node 612 which is beneficial for the reasons discussed in additional detail elsewhere in the specification. The AB bias circuit 606 may at least in some embodiments sense the drive voltages VGP and VGN of the PMOS/NMOS output transistors MP and MN by a feedback mechanism through the feedback column or circuit 608. By this feedback mechanism the AB bias circuit 606 may set the quiescent operating conditions of the PMOS/NMOS output transistors MP and MN. Hence, the AB bias circuit 606 sets the DC bias current flowing through the output transistors MP and MN under quiescent conditions, i.e. quiescent current at zero transducer signal voltage. The AB bias circuit 606 is configured such that the quiescent current in the class AB output stage 610 is significantly smaller than the maximum output current of the class AB output stage 610. The DC bias current of the class AB output stage 610 may in some exemplary embodiments of the transconductance amplifier 104 lie between 1 μA and 10 μA while the maximum output current may be lie between 100 μA and 1000 μA such as about 200 μA.

The transconductance amplifier 104 may be designed or configured to exhibit an output impedance, measured at 1 kHz, is larger than 1 MΩ, or preferably larger than 10 MΩ such as larger than 50 MΩ.

The skilled person will understand that the noise current flowing through an output transistors MP and MN would lead to unacceptable noise performance of the transconductance amplifier 104 in case the output stage 610 is biased in class A. This problem has been addressed and solved by the above-mentioned small level of quiescent current running in the class AB output stage 610, e.g. about 3 μA. The small quiescent current of the class AB output stage leads to a low noise current at small or zero microphone signal voltages at the inputs. On the other hand, the much larger maximum output current capability of the class AB output stage, as discussed above, leads to a higher noise level in class AB output stage 610 in the case of large magnitude of signal voltage. However, this is fully acceptable for numerous applications, in particular audio applications, because the higher noise level of the class AB output stage 610 at large output currents is perceptually masked by the large audio signal.

Consequently, the transconductance amplifier 104 exhibits a large dynamic range, satisfactory noise performance, large output impedance and low quiescent current/power consumption.

Figure 7:
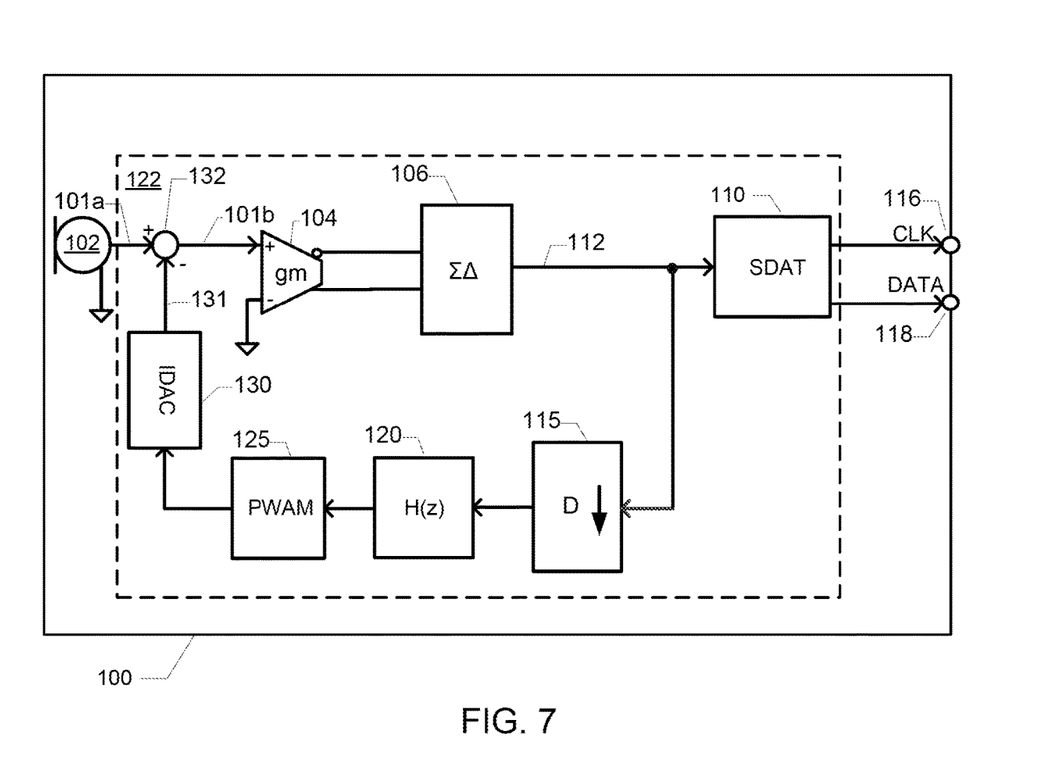
FIG. 7 is a simplified electrical block diagram of a processing circuit of a miniature microphone assembly according to various embodiments.

FIG. 7 is a simplified electrical block diagram of a processing circuit of a miniature microphone assembly according to various embodiments.

FIG. 7 shows embodiments of a processing circuit corresponding to the ones of FIGS. 3 and/or 4 but comprising further elements where all the elements illustrated in FIG. 7 correspond to the same elements of FIG. 2 of the Patentee's co-pending US application 2018/014123, incorporated herein by reference in its entirety, except for elements 104 and 106, where element 104 is a transconductance amplifier as disclosed herein (see e.g. 104 in FIGS. 3, 4, and 6) and element 106 is a current input analog-to-digital converter (I-ADC) (see e.g. 106 in FIGS. 3, 4, and 6). Elements 104 and 106 in US application 2018/014123 corresponds, respectively, to element 204 and 206 in the present disclosure.

Some aspects of the present disclosure relate to a microphone assembly including a housing including a base, a cover, and a sound port. The microphone assembly further includes a MEMS transducer element disposed in the housing, the transducer element configured to convert sound into a microphone signal voltage at a transducer output and a processing circuit. The housing may further include a host device interface with electrical contacts. The microphone assembly further includes a processing circuit where the processing circuit includes a transconductance amplifier including one or two input node(s) connected to the transducer output for receipt of the microphone signal voltage (single ended or differential). The transconductance amplifier is configured to generate an amplified current signal representative of the microphone signal voltage in accordance with a predetermined transconductance (gm) of the transconductance amplifier. The processing circuit additionally includes an analog-to-digital converter (I-ADC) having an input node connected to receive the amplified current signal. The analog-to-digital converter (I-ADC) is configured to sample and quantize the amplified current signal to generate a corresponding digital microphone signal.

Some aspects relate to a, e.g. portable, communication device including the microphone assembly according to the first aspect. The communication device may e.g. be a smartphone, a smart speaker (i.e. a speaker comprising a number of microphones to reliably obtain voice commands, etc.), an IoT (Internet of Things) device, a mobile phone, a tablet, etc.

Some aspects relate to a method of reducing noise of a signal amplification path of a microphone. The method includes a) converting incoming sound into a corresponding microphone signal voltage at a microphone transducer output; b) generating, by a transconductance amplifier, an amplified current signal representative of the microphone signal voltage in accordance with a predetermined transconductance (gm) of the transconductance amplifier; and c) sampling and quantizing the amplified current signal by an analog-to-digital converter (ADC) to generate a corresponding digital microphone signal.

Some aspects relate to a semiconductor die comprising a processing circuit. The processing circuit including a transconductance amplifier having one or two input node(s) for receipt of a microphone signal voltage (single ended or differential). The transconductance amplifier is configured to generate an amplified current signal representative of the microphone signal voltage in accordance with a predetermined transconductance (gm) of the transconductance amplifier. The processing circuit further includes an analog-to-digital converter (I-ADC) having an input node connected to receive the amplified current signal. The analog-to-digital converter (I-ADC) is configured to sample and quantize the amplified current signal to generate a corresponding digital microphone signal.

Some aspects relate to a first and a second semiconductor die. The first semiconductor die having a transconductance amplifier having one or two input node(s) for receipt of a microphone signal voltage (single ended or differential). The transconductance amplifier being configured to generate an amplified current signal representative of the microphone signal voltage in accordance with a predetermined transconductance (gm) of the transconductance amplifier. The second semiconductor die having an analog-to-digital converter (I-ADC) comprising an input node connected to receive the amplified current signal, said analog-to-digital converter (I-ADC) being configured to sample and quantize the amplified current signal to generate a corresponding digital microphone signal.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone assembly comprising:
a housing comprising a base, a cover, and a sound port;
a MEMS transducer element disposed in the housing, the transducer element configured to convert sound into a microphone signal voltage at a transducer output; and
a processing circuit comprising:
a transconductance amplifier comprising an input node connected to the transducer output for receipt of the microphone signal voltage, the transconductance amplifier configured to generate an amplified current signal representative of the microphone signal voltage in accordance with a predetermined transconductance of the transconductance amplifier; and
an analog-to-digital converter comprising an input node connected to receive the amplified current signal, the analog-to-digital converter being configured to sample and quantize the amplified current signal to generate a corresponding digital microphone signal, wherein an effective input impedance, at 1 kHz, of the analog-to-digital converter is smaller than 1 k$\Omega$.

2. A microphone assembly comprising:
a housing comprising a base, a cover, and a sound port;
a MEMS transducer element disposed in the housing, the transducer element configured to convert sound into a microphone signal voltage at a transducer output; and
a processing circuit comprising:
a transconductance amplifier comprising an input node connected to the transducer output for receipt of the microphone signal voltage, the transconductance amplifier configured to generate an amplified current signal representative of the microphone signal voltage in accordance with a predetermined transconductance of the transconductance amplifier; and an analog-to-digital converter comprising an input node connected to receive the amplified current signal, the analog-to-digital converter being configured to sample and quantize the amplified current signal to generate a corresponding digital microphone signal;

wherein a load resistance of the transconductance amplifier or an equivalent impedance, at 1 kHz, of the transconductance amplifier is larger than 1 MΩ.

3. A microphone assembly comprising:

a housing comprising a base, a cover, and a sound port;

a MEMS transducer element disposed in the housing, the transducer element configured to convert sound into a microphone signal voltage at a transducer output; and a processing circuit comprising:
   a transconductance amplifier comprising an input node connected to the transducer output for receipt of the microphone signal voltage, the transconductance amplifier configured to generate an amplified current signal representative of the microphone signal voltage in accordance with a predetermined transconductance of the transconductance amplifier; and
   an analog-to-digital converter comprising an input node connected to receive the amplified current signal, the analog-to-digital converter being configured to sample and quantize the amplified current signal to generate a corresponding digital microphone signal;

wherein the predetermined transconductance is larger than $$\frac{1}{400\,kohm}.$$

4. A microphone assembly comprising:

a housing comprising a base, a cover, and a sound port;

a MEMS transducer element disposed in the housing, the transducer element configured to convert sound into a microphone signal voltage at a transducer output; and a processing circuit comprising:
   a transconductance amplifier comprising an input node connected to the transducer output for receipt of the microphone signal voltage, the transconductance amplifier configured to generate an amplified current signal representative of the microphone signal voltage in accordance with a predetermined transconductance of the transconductance amplifier; and
   an analog-to-digital converter comprising an input node connected to receive the amplified current signal, the analog-to-digital converter being configured to sample and quantize the amplified current signal to generate a corresponding digital microphone signal;

wherein a product of the predetermined transconductance and a load resistance of the transconductance amplifier or an equivalent impedance is larger than 5.

5. A microphone assembly comprising:

a housing comprising a base, a cover, and a sound port;

a MEMS transducer element disposed in the housing, the transducer element configured to convert sound into a microphone signal voltage at a transducer output; and a processing circuit comprising:
   a transconductance amplifier comprising an input node connected to the transducer output for receipt of the microphone signal voltage, the transconductance amplifier configured to generate an amplified current signal representative of the microphone signal voltage in accordance with a predetermined transconductance of the transconductance amplifier; and
   an analog-to-digital converter comprising an input node connected to receive the amplified current signal, the analog-to-digital converter being configured to sample and quantize the amplified current signal to generate a corresponding digital microphone signal;

wherein an input impedance of the transconductance amplifier is larger than 100 MΩ.

6. The microphone assembly of claim 1, wherein the transconductance amplifier is a class AB transconductance amplifier.

7. The microphone assembly of claim 1, wherein a frequency of sound to be converted by the transducer element is larger than 0.1 Hz and less than 200 kHz.

8. The microphone assembly of claim 1, wherein the transducer element comprises a capacitive transducer that supplies the microphone signal voltage across first and second mutually charged transducer plates, and wherein the transducer element exhibits a transducer capacitance between 0.5 pF and 10 pF.

9. The microphone assembly of claim 1, wherein the analog-to-digital converter is a sigma-delta modulator or converter that generates a single-bit or a multibit digital microphone signal at a first sampling frequency.

10. The microphone assembly of claim 9, wherein the microphone assembly further comprises:
   a feedback path comprising:
      a digital loop filter configured to receive and filter the digital microphone signal to provide a first digital feedback signal;
      an additional digital-to-analog converter configured to convert the first digital feedback signal into a corresponding additional analog feedback signal; and
      a summing node at the transducer output configured to combine the microphone signal and the additional analog feedback signal.

11. A microphone assembly comprising:

a housing comprising a base, a cover, and a sound port;

a MEMS transducer element disposed in the housing, the transducer element configured to convert sound into a microphone signal voltage at a transducer output; and a processing circuit comprising:
   a transconductance amplifier comprising an input node connected to the transducer output for receipt of the microphone signal voltage, the transconductance amplifier configured to generate an amplified current signal representative of the microphone signal voltage in accordance with a predetermined transconductance of the transconductance amplifier;
   an analog-to-digital converter comprising an input node connected to receive the amplified current signal, the analog-to-digital converter being configured to sample and quantize the amplified current signal to generate a corresponding digital microphone signal, wherein the analog-to-digital converter is a sigma-delta modulator or converter that generates a single-bit or a multibit digital microphone signal at a first sampling frequency; and
   a feedback path comprising:
      a digital loop filter configured to receive and filter the digital microphone signal to provide a first digital feedback signal;

an additional digital-to-analog converter configured to convert the first digital feedback signal into a corresponding additional analog feedback signal; and a summing node at the transducer output configured to combine the microphone signal and the additional analog feedback signal;

wherein the additional digital-to-analog converter comprises:

a hybrid pulse-width and pulse-amplitude modulator configured to generate the additional analog feedback signal by converting the first digital feedback signal into a corresponding pulse-width and pulse-amplitude modulated signal at a higher sampling frequency than a sampling frequency associated with the first digital feedback signal.

12. The microphone assembly of claim 2, wherein a frequency of sound to be converted by the transducer element is larger than 0.1 Hz and less than 200 kHz.

13. The microphone assembly of claim 2, wherein the transducer element comprises a capacitive transducer that supplies the microphone signal voltage across first and second mutually charged transducer plates, and wherein the transducer element exhibits a transducer capacitance between 0.5 pF and 10 pF.

14. The microphone assembly of claim 3, wherein a frequency of sound to be converted by the transducer element is larger than 0.1 Hz and less than 200 kHz.

15. The microphone assembly of claim 3, wherein the transducer element comprises a capacitive transducer that supplies the microphone signal voltage across first and second mutually charged transducer plates, and wherein the transducer element exhibits a transducer capacitance between 0.5 pF and 10 pF.

16. The microphone assembly of claim 4, wherein a frequency of sound to be converted by the transducer element is larger than 0.1 Hz and less than 200 kHz.

17. The microphone assembly of claim 4, wherein the transducer element comprises a capacitive transducer that supplies the microphone signal voltage across first and second mutually charged transducer plates, and wherein the transducer element exhibits a transducer capacitance between 0.5 pF and 10 pF.

18. The microphone assembly of claim 5, wherein a frequency of sound to be converted by the transducer element is larger than 0.1 Hz and less than 200 kHz.

19. The microphone assembly of claim 5, wherein the transducer element comprises a capacitive transducer that supplies the microphone signal voltage across first and second mutually charged transducer plates, and wherein the transducer element exhibits a transducer capacitance between 0.5 pF and 10 pF.

20. The microphone assembly of claim 11, wherein a frequency of sound to be converted by the transducer element is larger than 0.1 Hz and less than 200 kHz.

21. The microphone assembly of claim 11, wherein the transducer element comprises a capacitive transducer that supplies the microphone signal voltage across first and second mutually charged transducer plates, and wherein the transducer element exhibits a transducer capacitance between 0.5 pF and 10 pF.

* * * * *